United States Patent
Yoon et al.

(10) Patent No.: US 9,371,484 B2
(45) Date of Patent: Jun. 21, 2016

(54) ORGANIC LIGHT EMITTING DIODE DEVICE AND LIQUID CRYSTAL TYPE EMITTING MATERIAL FOR THE SAME

(71) Applicant: LG Display Co., Ltd., Seoul (KR)

(72) Inventors: Kyung-Jin Yoon, Gyeonggi-do (KR);
Gee-Sung Chae, Incheon-si (KR);
Soon-Wook Cha, Gyeonggi-do (KR);
Kyung-Hoon Lee, Seoul (KR);
Seog-Shin Kang, Gyeonggi-do (KR);
Su-Yeon Lee, Gyeonggi-do (KR);
Hyo-Jin Noh, Gyeonggi-do (KR);
Dae-Wi Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 13/973,140

(22) Filed: Aug. 22, 2013

(65) Prior Publication Data
US 2014/0160398 A1   Jun. 12, 2014

(30) Foreign Application Priority Data

Dec. 7, 2012   (KR) .................. 10-2012-0141794

(51) Int. Cl.
*H01L 51/50* (2006.01)
*C09K 19/32* (2006.01)
*C09K 19/16* (2006.01)
*C09K 19/34* (2006.01)
*H01L 51/00* (2006.01)

(52) U.S. Cl.
CPC ............. *C09K 19/3491* (2013.01); *C09K 19/32* (2013.01); *H01L 51/0052* (2013.01); *H01L 51/0058* (2013.01); *H01L 51/0073* (2013.01); *H01L 51/0074* (2013.01); *C09K 19/16* (2013.01); *C09K 2019/3408* (2013.01); *H01L 51/0076* (2013.01)

(58) Field of Classification Search
None
See application file for complete search history.

(56) References Cited

U.S. PATENT DOCUMENTS

2004/0170861 A1\* 9/2004 Culligan et al. ............. 428/690
2005/0110384 A1\* 5/2005 Peterson .................. 313/318.01

FOREIGN PATENT DOCUMENTS

GB   2424881 A   \* 10/2006
KR   2009088177 A   \* 8/2009

OTHER PUBLICATIONS

Peng et al., "New Fluorene Derivatives for Blue Electroluminescent Devices: Influence of Substituents on Thermal Properties, Photoluminescence, and Electroluminescence", Journal of Physical Chemistry C, 2008, 112, 2165-2169.\*
Eastwood et al., "Synthesis and Luminous Properties of electroluminescent Liquid Crystals", Synthetic Metals, 2001, 121, 1659-1660.\*
English Translation of KR2009088177.\*
Cho et al., "Solid-Phase Synthesis of Unsymmetrical trans-Stilbenes", Dec. 4, 2009, Journal of Combinatorial Science, 2010, 12, 45-50.\*

(Continued)

*Primary Examiner* — Cynthia H Kelly
*Assistant Examiner* — Anna Malloy
(74) *Attorney, Agent, or Firm* — Morgan, Lewis & Bockius LLP

(57) ABSTRACT

An organic light emitting diode (OLED) device includes a first electrode; a second electrode facing the first electrode; an emitting material layer disposed between the first and second electrodes and a horizontally oriented liquid crystal type emitting material.

6 Claims, 8 Drawing Sheets

(56) References Cited

OTHER PUBLICATIONS

Office Action dated Sep. 21, 2015 issued by the State Intellectual Property Office of the People's Republic of China (SIPO) in related Chinese Patent Application No. 201310386655.2 and an English-language translation thereof.

Second Chinese Office Action issued on Feb. 26, 2016 in corresponding Chinese Patent Application No. 201310386655.2, with English-language translation.

Cho et al., "Solid-Phase Synthesis of Unsymmetrical trans-Stilbenes", J. Comb. Chem., 12(1):45-50 (2010).

* cited by examiner

ORGANIC LIGHT EMITTING DIODE DEVICE AND LIQUID CRYSTAL TYPE EMITTING MATERIAL FOR THE SAME

The present application claims the benefit of Korean Patent Application No. 10-2012-0141794 filed in Korea on Dec. 7, 2012, which is herein incorporated by reference.

BACKGROUND OF THE INVENTION

1. Field of the Invention

The present invention relates to an organic light emitting diode (OLED) device and more particularly to a liquid crystal type emitting material being capable of being horizontally oriented and having improved emitting efficiency and an OLED device including the same.

2. Discussion of the Related Art

Recently, requirement for flat panel display devices having small occupied area is increased. Among the flat panel display devices, an OLED device, which may be called to as an organic electroluminescent device, is widely introduced.

The OLED device emits light by injecting electrons from a cathode as an electron injection electrode and holes from an anode as a hole injection electrode into an emission compound layer, combining the electrons with the holes, generating an exciton, and transforming the exciton from an excited state to a ground state. A flexible substrate, for example, a plastic substrate, can be used as a base substrate where elements are formed. Since the OLED device does not require a backlight assembly, the OLED device has low weight and low power consumption. Moreover, the OLED device can be operated at a voltage (e.g., 10V or below) lower than a voltage required to operate other display devices. In addition, the OLED device is adequate to produce full-color images.

FIG. 1 is a schematic cross-sectional view of the related art OLED device.

As shown in FIG. 1, the OLED device includes a first substrate (not shown), a second substrate (not shown) and an organic emitting diode E between the first and second substrates.

The organic emitting diode E includes a first electrode 10, a second electrode 30 and an organic emitting layer 20. The first electrode 10 is formed of a material having a relatively high work function to serve as an anode. For example, the first electrode 10 may be formed of indium-tin-oxide (ITO). The second electrode 30 is formed of a material having a relatively low work function to serve as a cathode. For example, the second electrode 30 may be formed of aluminum (Al) or Al alloy.

To increase emission efficiency, the organic emitting layer 20 includes a hole injecting layer (HIL) 21, a hole transporting layer (HTL) 22, an emitting material layer (EML) 23, an electron transporting layer (ETL) 24 and an electron injecting layer (EIL) 25.

In the OLED device, the hole from the first electrode 10 as an anode is transferred into the emitting material layer 23 through the hole injecting layer 21 and the hole transporting layer 22, and the electron from the second electrode 30 as a cathode is transferred into the emitting material layer 23 through the electron injecting layer 25 and the electron transporting layer 24. The hole and the electron combines in the emitting material layer 23 to emit light.

For example, material in following Formula 1-1 or Formula 1-2 are used for the emitting material layer 23.

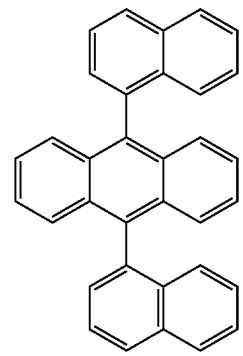

[Formula 1-1]

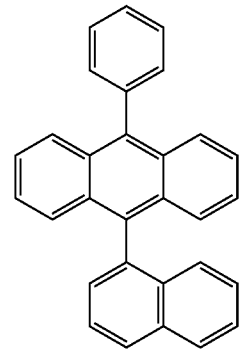

[Formula 1-2]

Referring again to FIG. 1, the materials are randomly arranged in the emitting material layer 23. The randomly arranged materials cause a limitation in the emitting efficiency, i.e., a limitation in brightness, and decrease of power consumption of the OLED device.

SUMMARY OF THE INVENTION

Accordingly, the present invention is directed to an OLED device and a liquid crystal type emitting material for the same that substantially obviate one or more of the problems due to limitations and disadvantages of the related art.

An object of the present invention is to provide a liquid crystal type emitting material being capable of being horizontally oriented.

Another object of the present invention is to provide an OLED having increase of brightness and decrease of power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention provides an organic light emitting diode (OLED) device including a first electrode; a second electrode facing the first electrode; an emitting material layer disposed between the first and second electrodes and including a liquid crystal type emitting material being horizontally oriented.

In another aspect of the present invention, the present invention provides a liquid crystal type emitting material used for an emitting material layer of an organic emitting material layer, the liquid crystal type emitting material represented by:

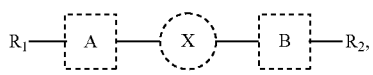

wherein X is substituted or non-substituted aromatic group, and each of A and B is independently selected from substituted or non-substituted aromatic group, substituted or non-substituted heterocyclic group, substituted or non-substituted C1~C25 aliphatic group and substituted or non-substituted C1~C25 alkoxy group, and wherein each of R1 and R2 is independently selected from hydrogen, substituted or non-substituted C1~C30 aliphatic group, substituted or non-substituted C1~C30 alkoxy group, substituted or non-substituted cyano group and halogen atoms.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

As described above, the limitation in the emitting efficiency in the OLED device may be caused by an orientation state of the emitting materials.

In the related art OLED device where the emitting materials are randomly oriented, light from the emitting material is emitted in all directions. In other words, the light is randomly emitted. For example, referring to FIG. 2, which is a schematic view for illustrating brightness limitations in an OLED device, the randomly oriented emitting materials 40 emit light in all direction, and the light becomes extinct inside the OLED device because of a refractive index difference between the substrate of the OLED device and exterior air. Accordingly, there is a limitation in increase of brightness.

To resolve the above problems, an OLED device and a light crystal type emitting material for the OLED device are introduced.

Figure 3:
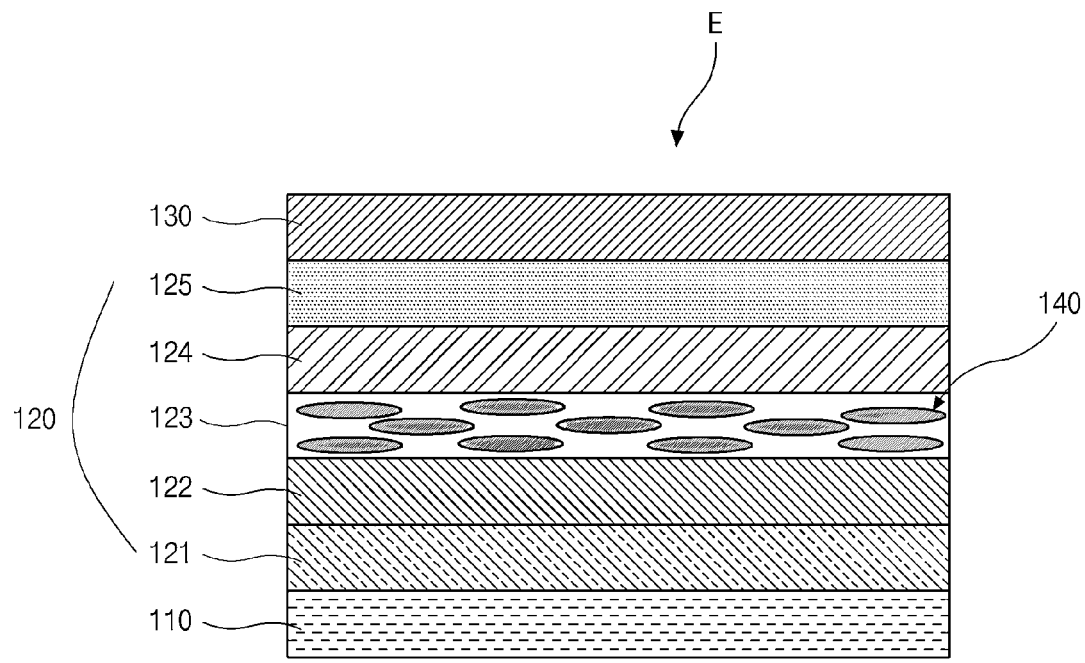
FIG. 3 is a schematic cross-sectional view of an OLED device according to the present invention.

FIG. 3 is a schematic cross-sectional view of an OLED device according to the present invention.

As shown in FIG. 3, an OLED device according to the present invention includes a first substrate (not shown), a second substrate (not shown) and an organic emitting diode E between the first and second substrates.

The organic emitting diode E includes a first electrode 110, a second electrode 130 and an organic emitting layer 120. The first electrode 110 is formed of a material having a relatively high work function to serve as an anode. For example, the first electrode 110 may be formed of indium-tin-oxide (ITO). The second electrode 130 is formed of a material having a relatively low work function to serve as a cathode. For example, the second electrode 130 may be formed of aluminum (Al) or Al alloy.

To increase emission efficiency, the organic emitting layer 120 includes a hole injecting layer (HIL) 121, a hole transporting layer (HTL) 122, an emitting material layer (EML) 123, an electron transporting layer (ETL) 124 and an electron injecting layer (EIL) 125 stacked on the first electrode 110.

The emitting material layer 123 includes liquid crystal type emitting materials 140. The liquid crystal type emitting materials 140 are horizontally oriented. Namely, a major axis of the liquid crystal type emitting materials 140 are arranged to be substantially parallel to a surface of at least one of the first and second electrodes 110 and 130. That is, a transition dipole of the liquid crystal type emitting materials 140 is substantially parallel to the surface of at least one of the first and second electrodes 110.

In the OLED device, the hole from the first electrode 110 as an anode is transferred into the emitting material layer 123 through the hole injecting layer 121 and the hole transporting layer 122, and the electron from the second electrode 130 as a cathode is transferred into the emitting material layer 123 through the electron injecting layer 125 and the electron transporting layer 124. The hole and the electron combines in the emitting material layer 123 to emit light.

The liquid crystal type emitting materials 140 in the emitting material layer 123 emit light along a vertical direction with respect to a direction of the transition dipole. Since the liquid crystal type emitting materials 140 are oriented such that the transition dipole of the liquid crystal type emitting materials 140 is substantially parallel to the surface of the first and second electrodes 110, the light from the liquid crystal type emitting materials 140 is emitted to be perpendicular to the surface of the first and second electrodes 110.

In this instance, since amount of the light emitted in side directions is decreased, amount of the light to be extinct inside the OLED device is also decreased. Accordingly, the brightness limitation in the related art OLED device can be overcome.

In addition, since a distance between the horizontally oriented liquid crystal type emitting materials 140 is reduced in comparison to the randomly oriented emitting materials, mobility of the electron and the hole is improved. As a result, a driving voltage of the OLED device is lowered.

Moreover, the liquid crystal type emitting materials 140 in the emitting material layer 123 of the OLED device has a self-orientation property. Namely, the liquid crystal type emitting materials 140 has characteristics of a liquid crystal phase in an operation temperature, i.e., about 25 to 500° C., of the OLED device such that the liquid crystal type emitting materials 140 are self-oriented to be substantially parallel to the surface of the first substrate 110. Accordingly, without an orientation process for horizontally orientation of the emitting materials, there are advantages in the fabricating process and the production costs.

On other hand, to improve the horizontal orientation of the liquid crystal type emitting materials 140, a horizontal orientation layer may be formed between the first electrode 110 and the emitting material layer 123 and/or between the second electrode 130 and the emitting material layer 123.

The liquid crystal type emitting material 140 has one of a lyotropic phase, a nematic phase, a smectic phase, a cholesteric phase and a discotic phase.

Figure 4A:
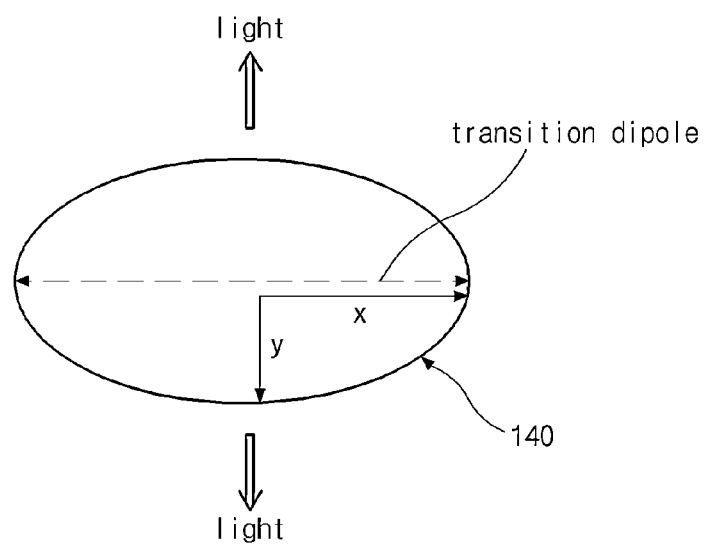
FIGS. 4A to 4C are schematic perspective view of liquid crystal type emitting materials according to the present invention.
Figure 4B:
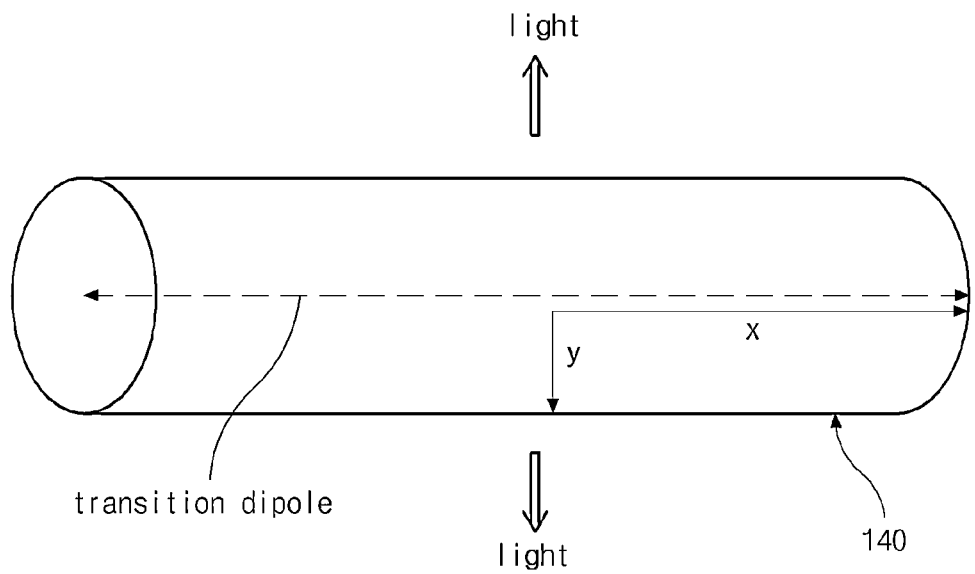

For example, as shown in FIG. 4A, the liquid crystal type emitting material 140 has a rod shape, and the liquid crystal type emitting material 140 is oriented such that the transition dipole of the liquid crystal type emitting material 140 becomes to be substantially parallel to the first electrode 110 (of FIG. 3) and/or the second electrode 130 (of FIG. 3). Alternatively, as shown in FIG. 4B, the liquid crystal type emitting material 140 has an oval shape, and the liquid crystal type emitting material 140 is oriented such that the transition dipole of the liquid crystal type emitting material 140 becomes to be parallel to the first electrode 110 and/or the second electrode 130. Alternatively, as shown in FIG. 4C, the liquid crystal type emitting material 140 has a disc shape, and the liquid crystal type emitting material 140 is oriented such that the transition dipole of the liquid crystal type emitting material 140 becomes to be parallel to the first electrode 110 and/or the second electrode 130.

Figure 4C:
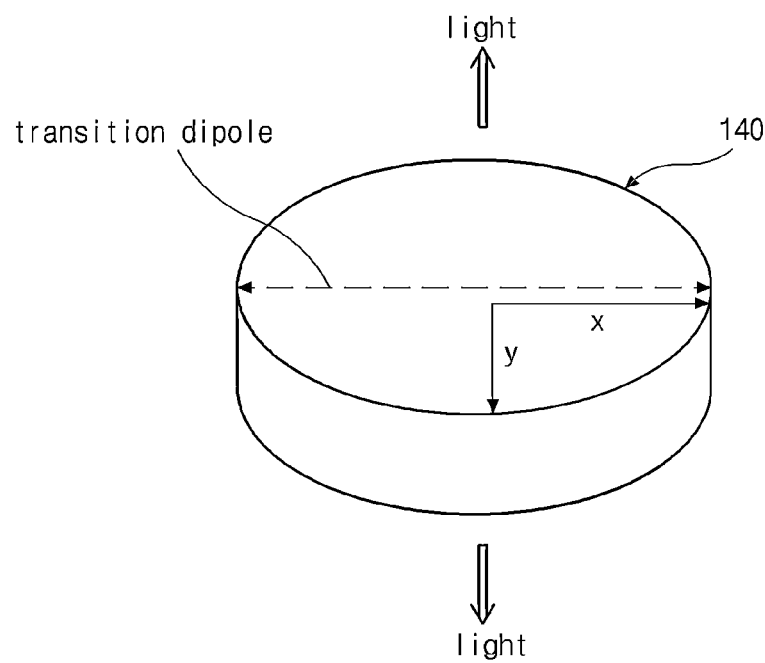
Figure 5A:
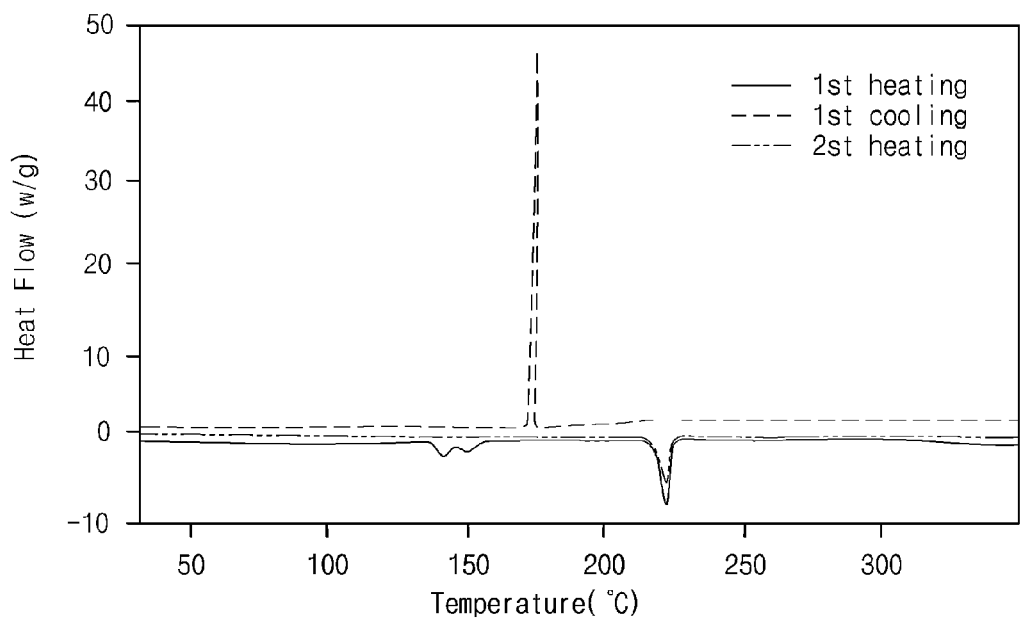
FIGS. 5A to 5E are differential thermal analysis graphs of liquid crystal type emitting materials according to the present invention.
Figure 5B:
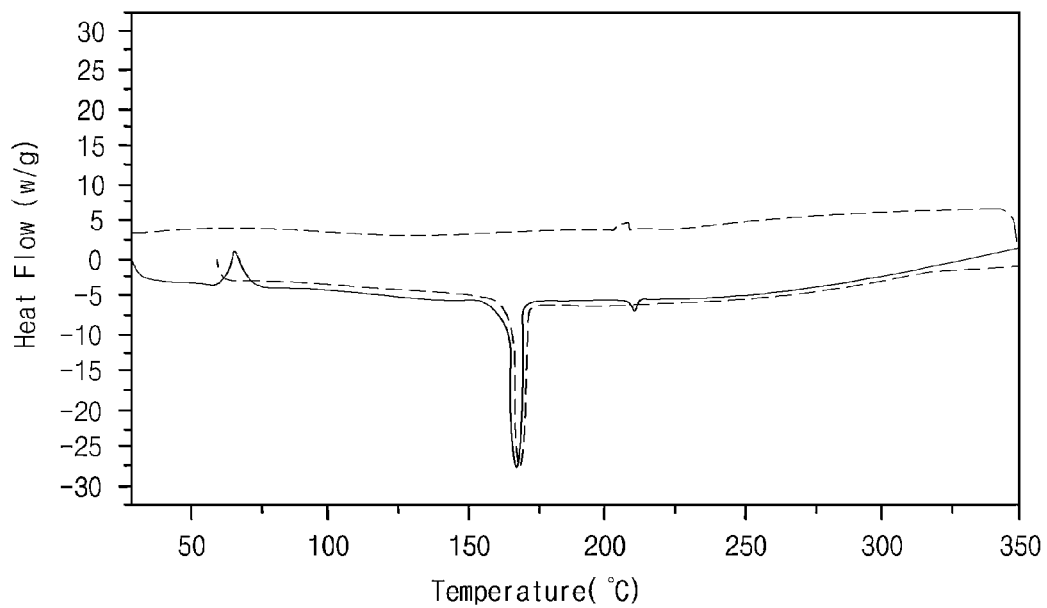
Figure 5C:
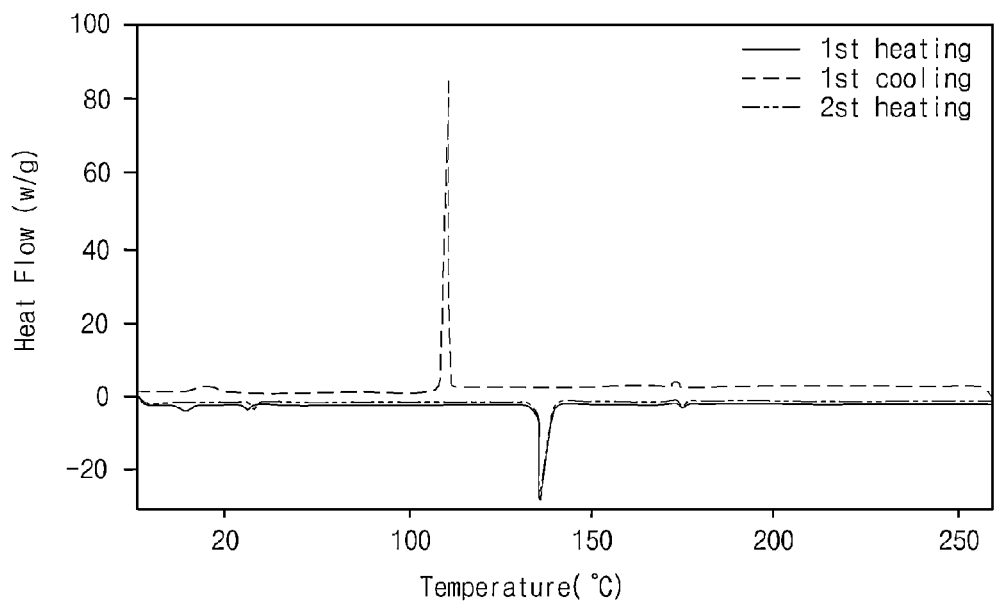
Figure 5D:
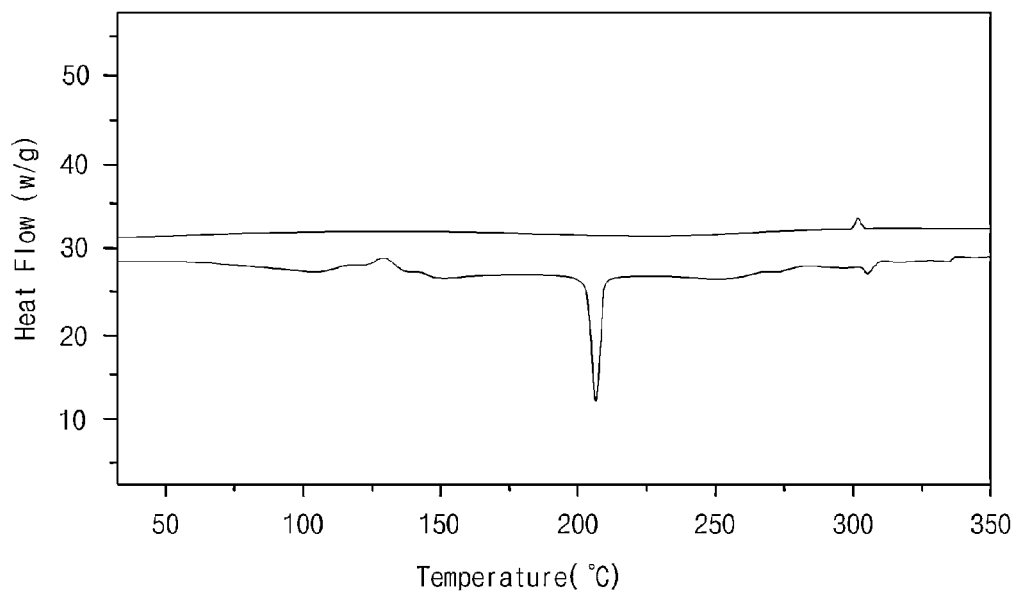
Figure 5E:
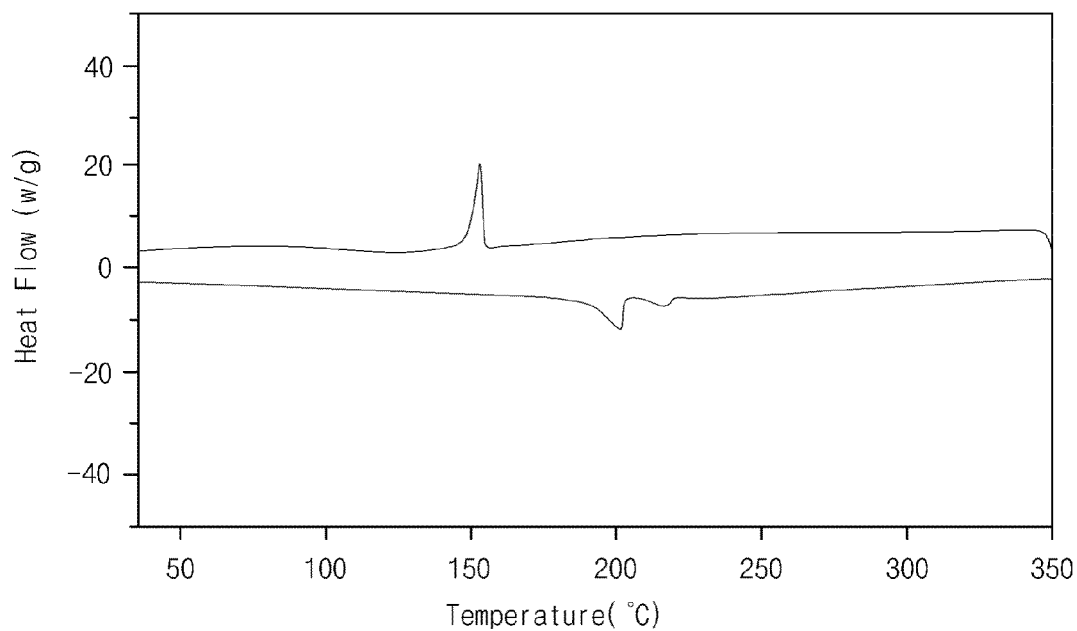
Figure 6A:
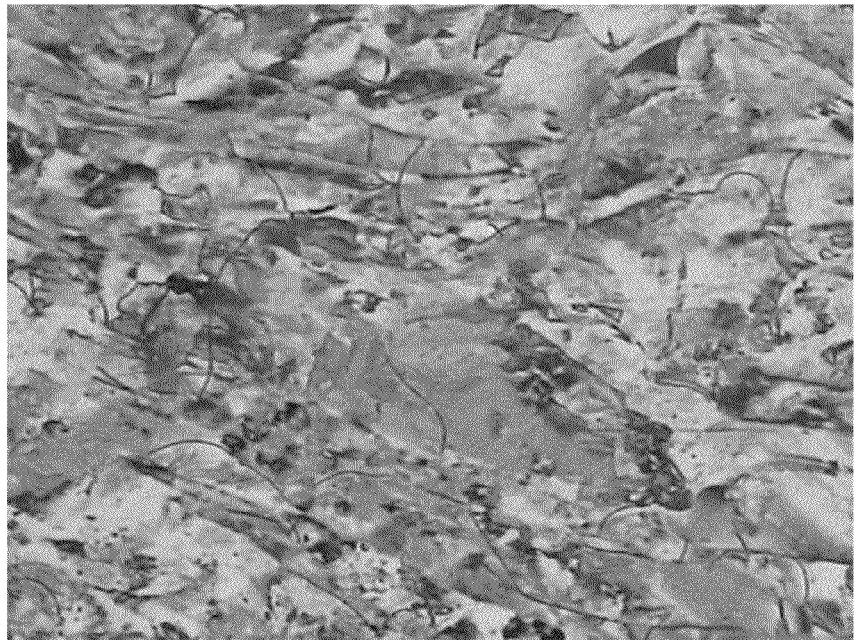
FIGS. 6A to 6E are polarized light microscopy pictures of liquid crystal type emitting materials according to the present invention.
Figure 6B:
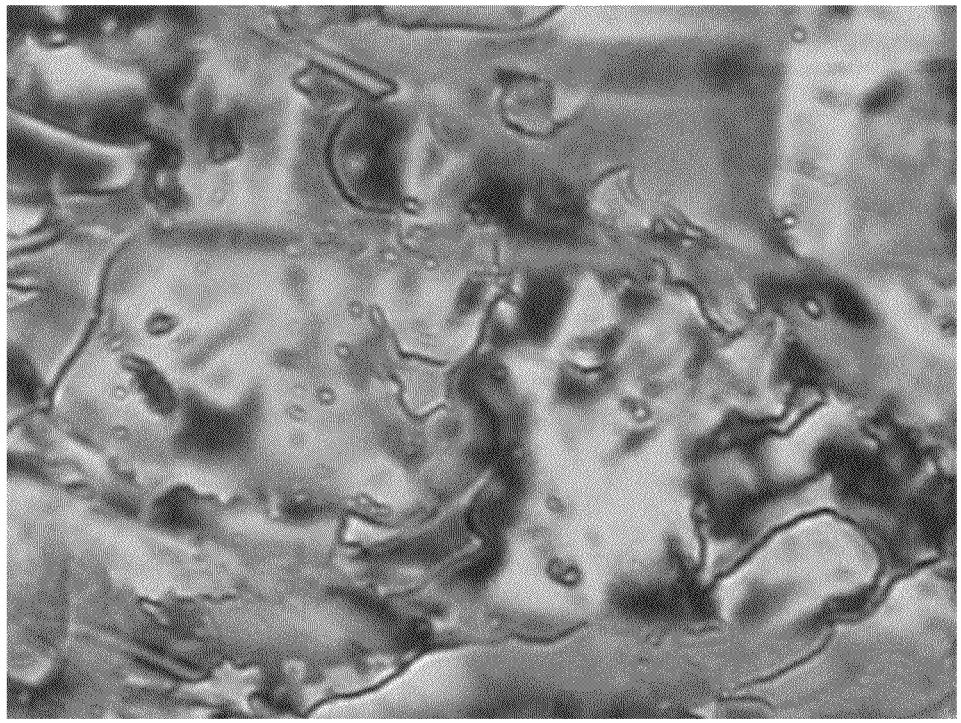
Figure 6C:
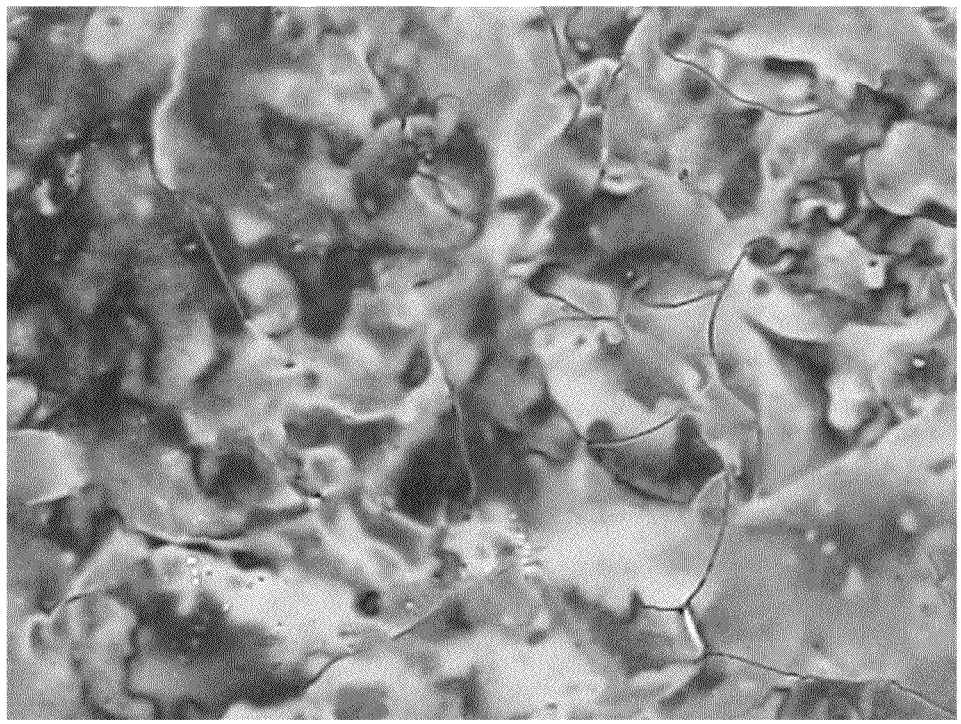
Figure 6D:
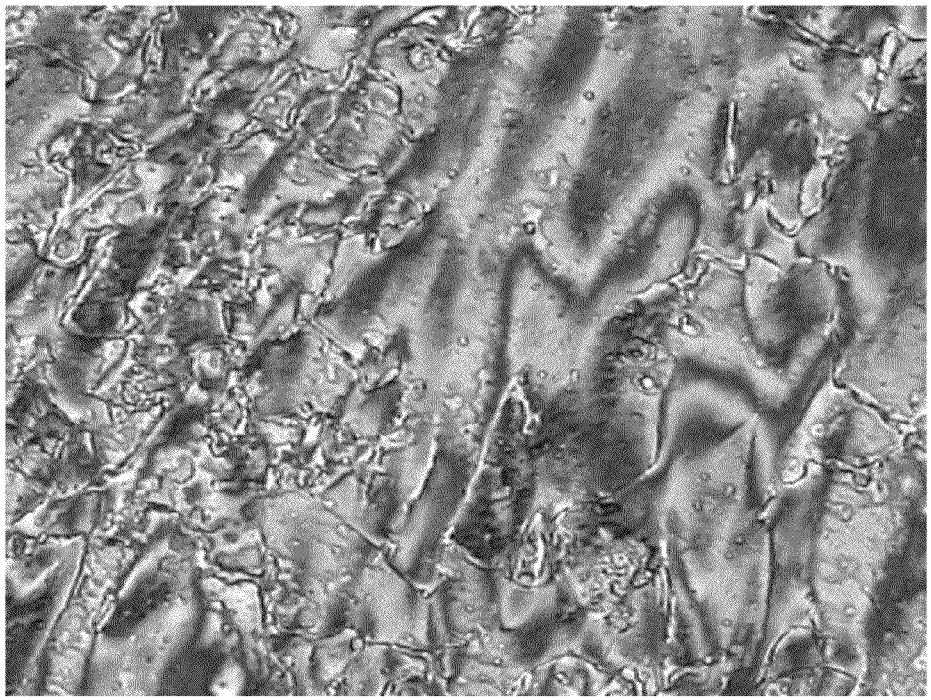
Figure 6E:

As shown in FIGS. 4A to 4C, the liquid crystal type emitting material 140 has a length along an x direction being larger than a thickness along an y direction and is oriented such that the transition dipole along the x direction of the liquid crystal type emitting material 140 is substantially parallel to the first electrode 110 and/or the second electrode 130. In other words, the liquid crystal type emitting material 140 is oriented such that a major axis of the liquid crystal type emitting material 140 is substantially parallel to the first electrode 110 and/or the second electrode 130.

The liquid crystal type emitting material 140 is used as a host or a dopant of the emitting material layer 140. The liquid crystal type emitting material 140 may be deposited by a thermal deposition method or an e-beam deposition method or coated by a solution type printing method or a laser printing method.

As described above, in the present invention, since the emitting material layer of the OLED device is formed by horizontally orienting the liquid crystal type emitting materials 140 of an isotropic shape, light from the emitting material layer is emitted to be substantially perpendicular to a direction of the transition dipole of the liquid crystal type emitting materials 140. As a result, the brightness of the OLED device is increased. In addition, a distance between adjacent liquid crystal type emitting materials 140, which are horizontally oriented, is to be shorter such that mobility of the hole and the electron is improved. As a result, a driving voltage of the OLED device is lowered.

Hereinafter, a structure and synthesis of the liquid crystal type emitting material will be explained.

The liquid crystal type emitting material according to the present invention is represented by following Formula 2. The liquid crystal type emitting material includes a core X of aromatic group and substituents A and B, which are respectively substituted by R1 and R2, at the core X. The liquid crystal type emitting material may have a linear shape or a rod shape. The liquid crystal type emitting material has emissive and liquid crystal phase properties.

[Formula 2]

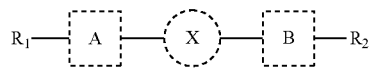

In the above Formula 2, X is substituted or non-substituted aromatic group. For example, X may be selected from fluorene, stilbene, benzene, naphthalene and anthracene.

Each of A and B is independently selected from substituted or non-substituted aromatic group, substituted or non-substituted heterocyclic group, substituted or non-substituted C1~C25 aliphatic group and substituted or non-substituted C1~C25 alkoxy group. A and B are same or different. For example, each of A and B may be selected from benzene, naphthalene, biphenyl, dibenzothiophene and dibenzofuran.

Each of R1 and R2 is independently selected from hydrogen, substituted or non-substituted C1~C30 aliphatic group, substituted or non-substituted C1~C30 alkoxy group, substituted or non-substituted cyano group and halogen atoms, e.g., fluorine (F). R1 and R2 is same or different.

The liquid crystal type emitting material in the above Formula 2 has a shape having a major axis, e.g., a linear shape or a rod shape, and is horizontally oriented such that the OLED device has an improved emitting property.

Figure 1:
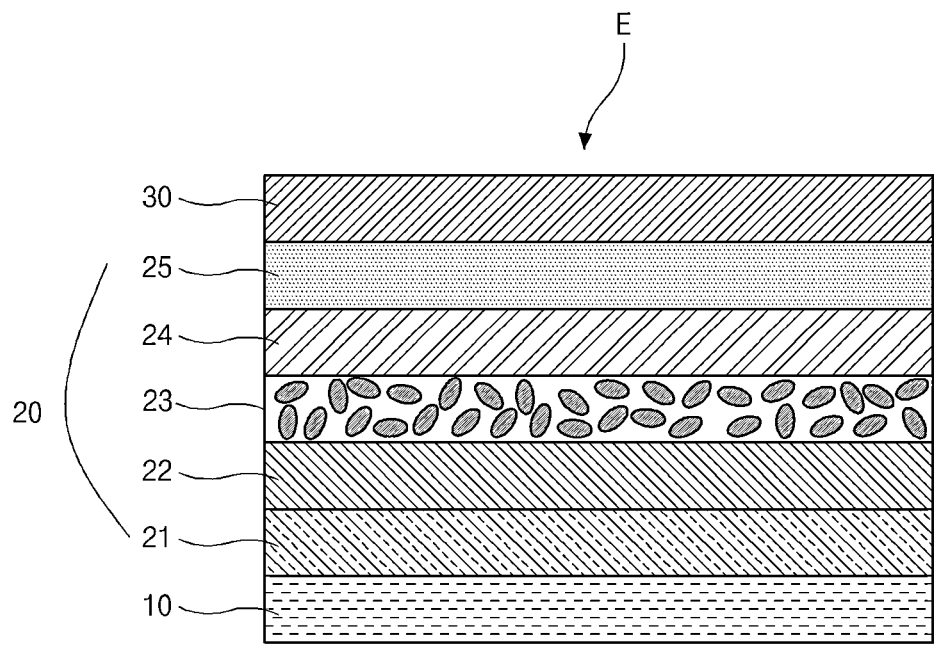
FIG. 1 is a schematic cross-sectional view of the related art OLED device.
Figure 2:
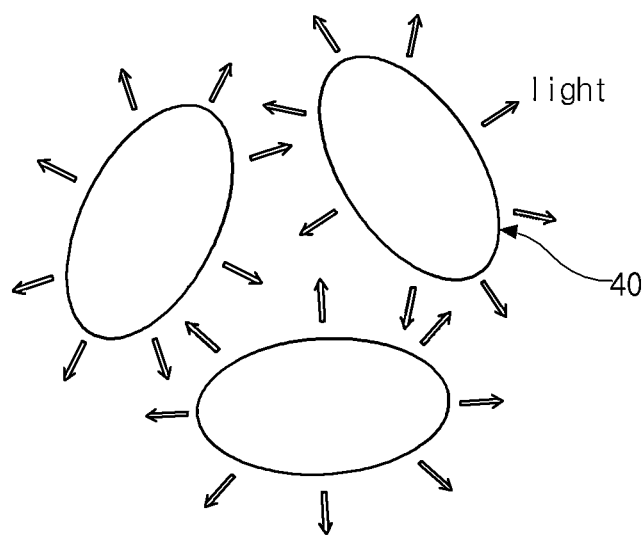
FIG. 2 is a schematic view for illustrating brightness limitations in an OLED device.

For example, the liquid crystal type emitting material in FIG. 2 may be one of the materials in following Formula 3. In Formula 3, R is an aliphatic compound.

[Formula 3]

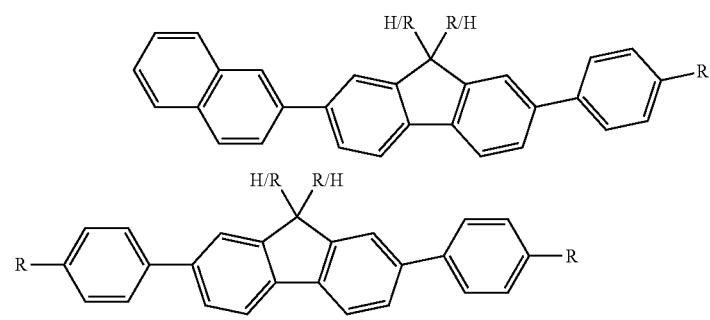

-continued
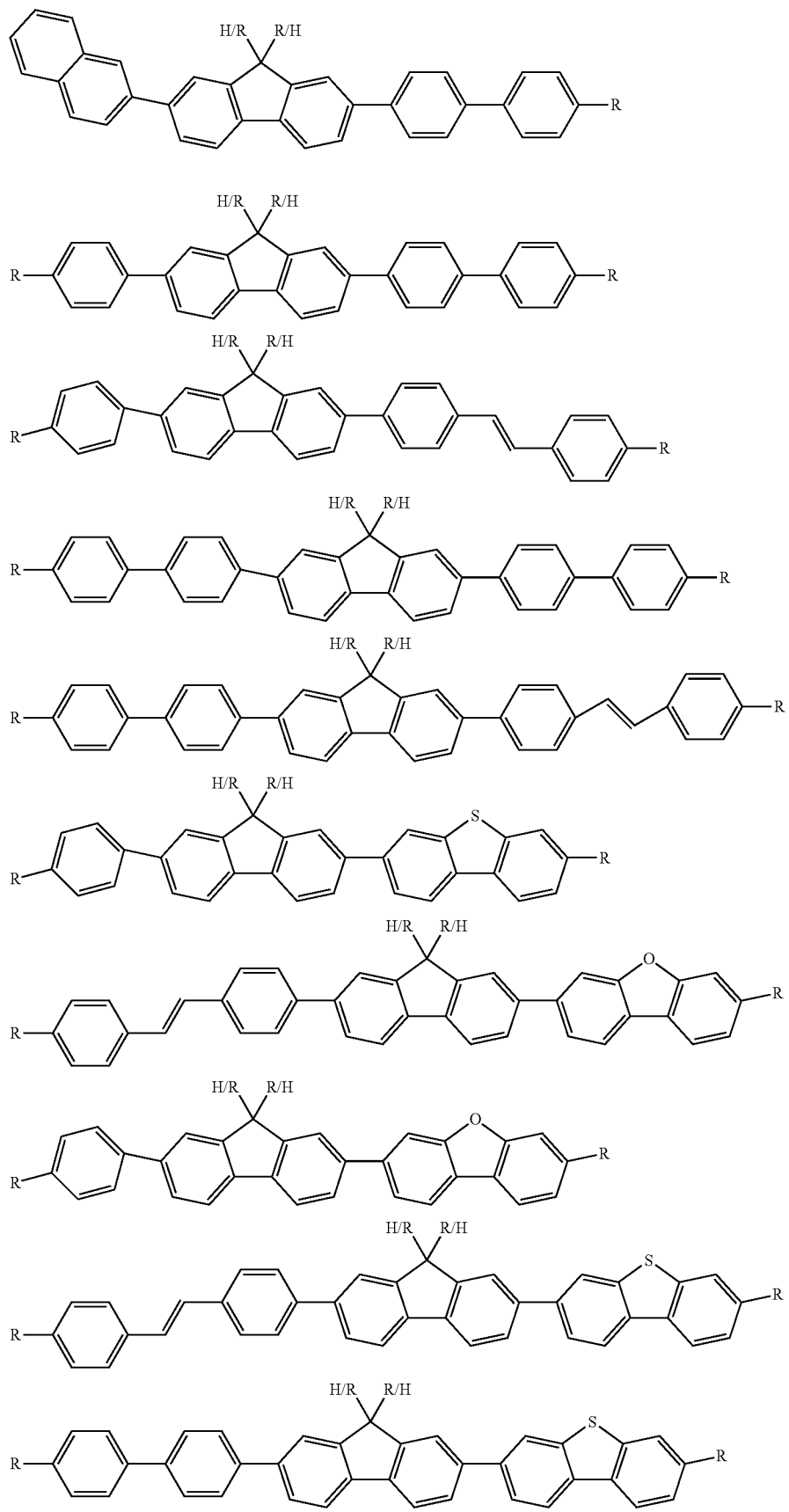

-continued
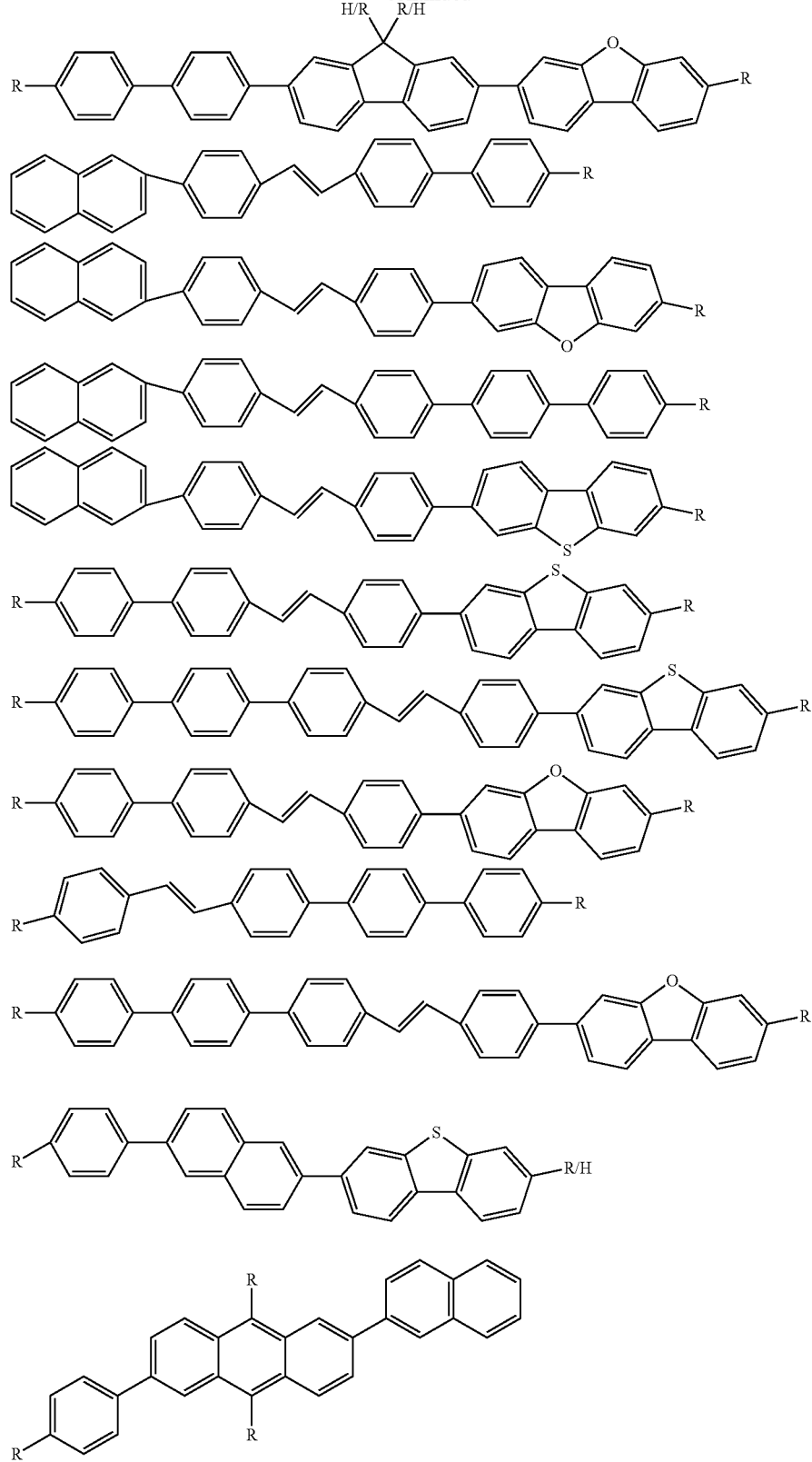
Hereinafter, synthesis of the liquid crystal type emitting materials in following Formulas 4-1 and 4-2 are explained.

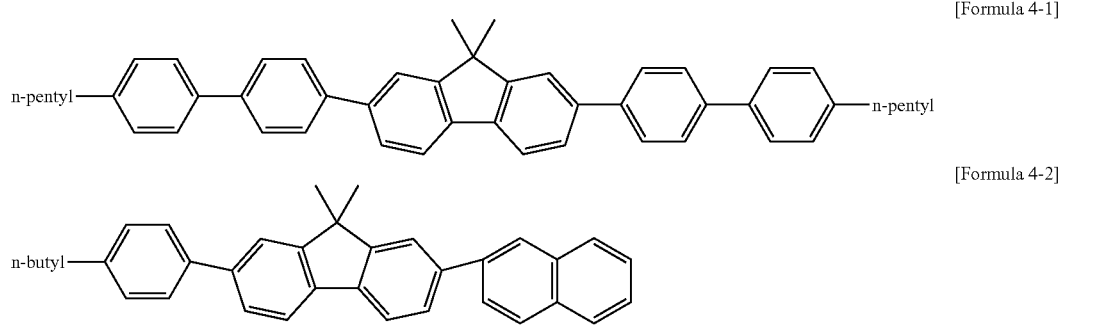

[Formula 4-1]

[Formula 4-2]

1. Synthesis of "4-1" Material

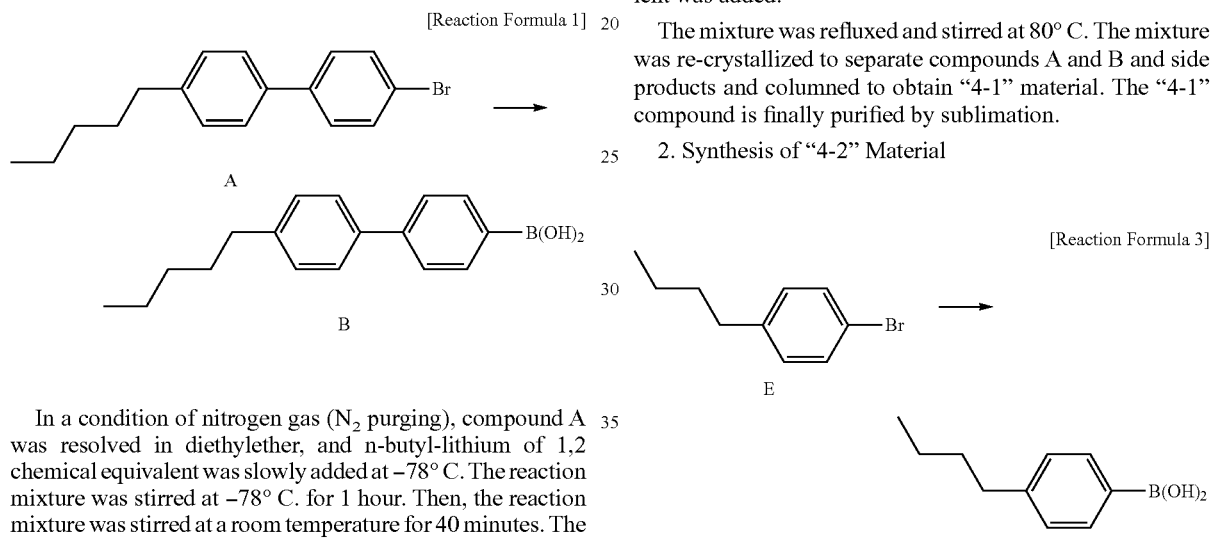

[Reaction Formula 1]

In a condition of nitrogen gas ($N_2$ purging), compound A was resolved in diethylether, and n-butyl-lithium of 1,2 chemical equivalent was slowly added at −78° C. The reaction mixture was stirred at −78° C. for 1 hour. Then, the reaction mixture was stirred at a room temperature for 40 minutes. The reaction mixture was cooled into −78° C. with slowly adding triethyl borate and was stirred at a room temperature for 1 hours.

The reaction mixture was slowly put into 1N-HCl and stirred for 1 hour. After stirring, diethylether was removed by N2 blowing such that solid powders were dropped on water. The solid powders on water were filtered at a reduced pressure to obtain compound B.

[Reaction Formula 2]

In a condition of nitrogen gas ($N_2$ purging), compound C was resolved in toluene, and the compound B of 2.2 chemical equivalent was added. $K_2CO_3$ of 4.4 chemical equivalent was resolved in $H_2O$ and added in the mixture. Some tetrahydrofuran was added, and palladium (Pd) of 0.05 chemical equivalent was added.

The mixture was refluxed and stirred at 80° C. The mixture was re-crystallized to separate compounds A and B and side products and columned to obtain "4-1" material. The "4-1" compound is finally purified by sublimation.

2. Synthesis of "4-2" Material

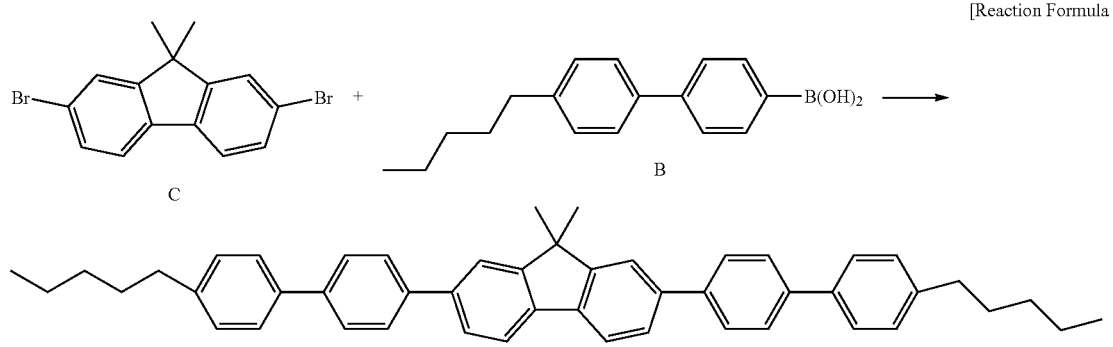

[Reaction Formula 3]

In a condition of nitrogen gas ($N_2$ purging), 1-bromo-4-butylbenzene was resolved in diethylether, and n-butyl-lithium of 1,2 chemical equivalent was slowly added at −78° C. The reaction mixture was stirred at −78° C. for 1 hour. Then, the reaction mixture was stirred at a room temperature for 40 minutes. The reaction mixture was cooled into −78° C. with slowly adding triethylborate and was stirred at a room temperature for 1 hours.

The reaction mixture was slowly put into 1N-HCl and stirred for 1 hour and was extracted by ethylacetate. The resultant was columned using hexane to separate compound E and side products and was columned again using alcohol to obtain 4-butylphenylboronic acid (compound F).

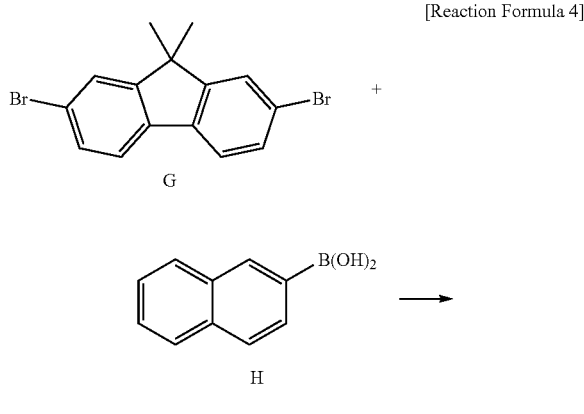

[Reaction Formula 4]

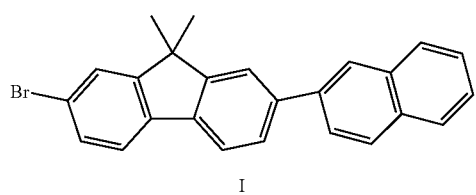

In a condition of nitrogen gas (N$_2$ purging), compound G was resolved in toluene, and compound H of 1.1 chemical equivalent was added. K$_2$CO$_3$ of 4.4 chemical equivalent was resolved in H$_2$O and added in the mixture. Some tetrahydrofuran was added, and palladium (Pd) of 0.05 chemical equivalent was added.

The mixture was refluxed and stirred at 80° C. The mixture was re-crystallized to separate compounds G and H and side products and columned using hexane to obtain compound I.

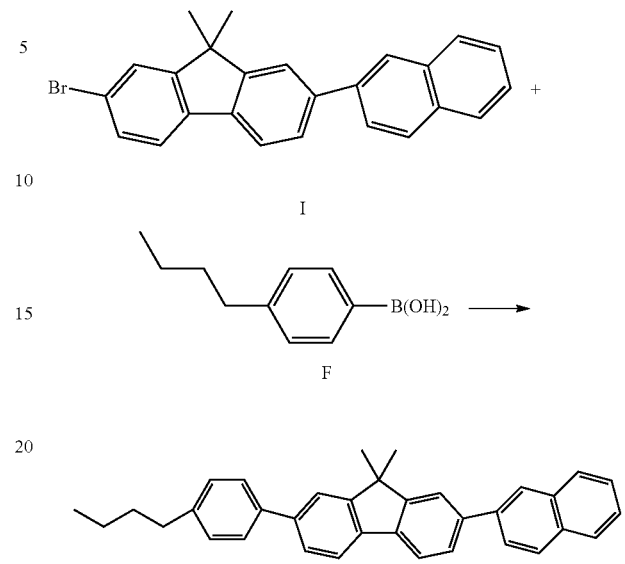

[Reaction Formula 5]

In a condition of nitrogen gas (N$_2$ purging), the compound I was resolved in toluene, and the compound F of 1.2 chemical equivalent was added. K$_2$CO$_3$ of 4.4 chemical equivalent was resolved in H$_2$O and added in the mixture. Some tetrahydrofuran was added, and palladium (Pd) of 0.05 chemical equivalent was added.

The mixture was refluxed and stirred at 80° C. The mixture was re-crystallized with alcohol to separate compounds I and F and side products to obtain "4-2" material. The "4-2" compound is finally purified by sublimation.

Differential thermal analysis graphs of the liquid crystal type emitting materials in the above Formulas 4-1 and 4-2 and following Formulas 5-1 to 5-3 are shown in FIGS. 5A to 5E, and their polarized light microscopy pictures are shown in FIGS. 6A to 6E.

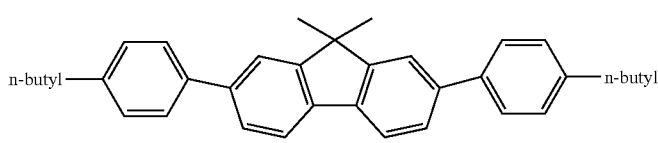

[Formula 5-1]

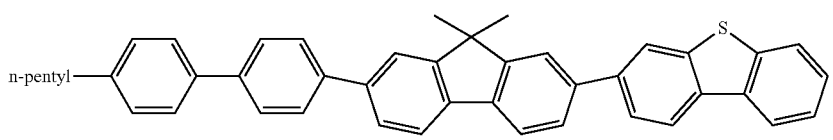

[Formula 5-2]

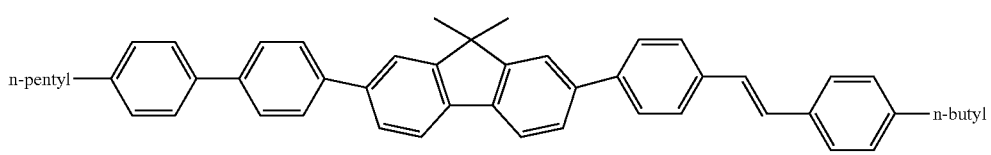

[Formula 5-3]

A melting point (Tm) and an anisotropic transition temperature (Tiso) are listed in Table 1.

TABLE 1

|  | "4-1" compound | "4-2" compound | "5-1" compound | "5-1" compound | "5-1" compound |
|---|---|---|---|---|---|
| $T_m$ [° C.] | 210 | 167 | 140 | 206 | 201 |
| $T_{iso}$ [° C.] | 305 | 210 | 175 | 305 | 219 |

As shown in FIGS. 5A-5E and 6A-6E and Table 1, since the liquid crystal type emitting material of the present invention has a liquid crystal phase characteristics at an operation temperature range, i.e., about 25 to 500° C., of the OLED device, the liquid crystal type emitting material are horizontally oriented in the emitting material layer 123 (of FIG. 3) of the OLED device. Accordingly, light is emitted from the emitting material layer 123 to be substantially perpendicular to a direction of the transition dipole of the horizontally oriented liquid crystal type emitting material such that brightness of the OLED device is improved. In addition a distance between adjacent liquid crystal type emitting materials, which are horizontally oriented, is to be shorter such that mobility of the hole and the electron is improved. As a result, a driving voltage of the OLED device is lowered.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode (OLED) device, comprising:
   a first electrode;
   a second electrode facing the first electrode; and
   an emitting material layer disposed between the first and second electrodes and comprising a liquid crystal emitting material horizontally oriented so that a major axis of the liquid crystal emitting material is substantially parallel to at least one of the first and second electrodes,
wherein the liquid crystal emitting material is selected from the group consisting of:

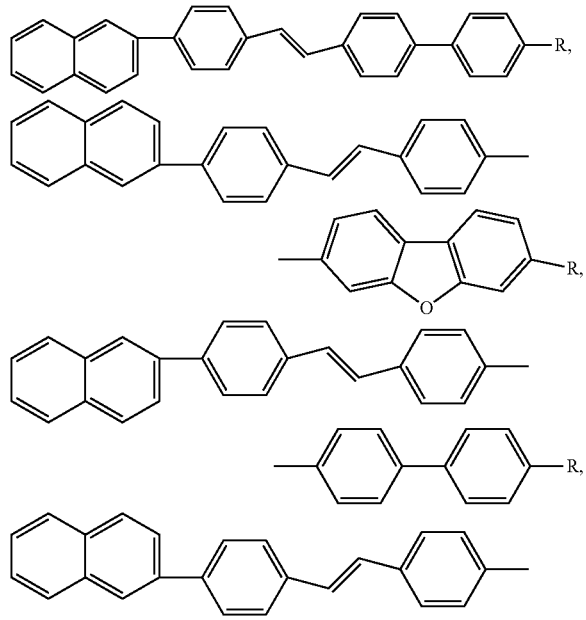

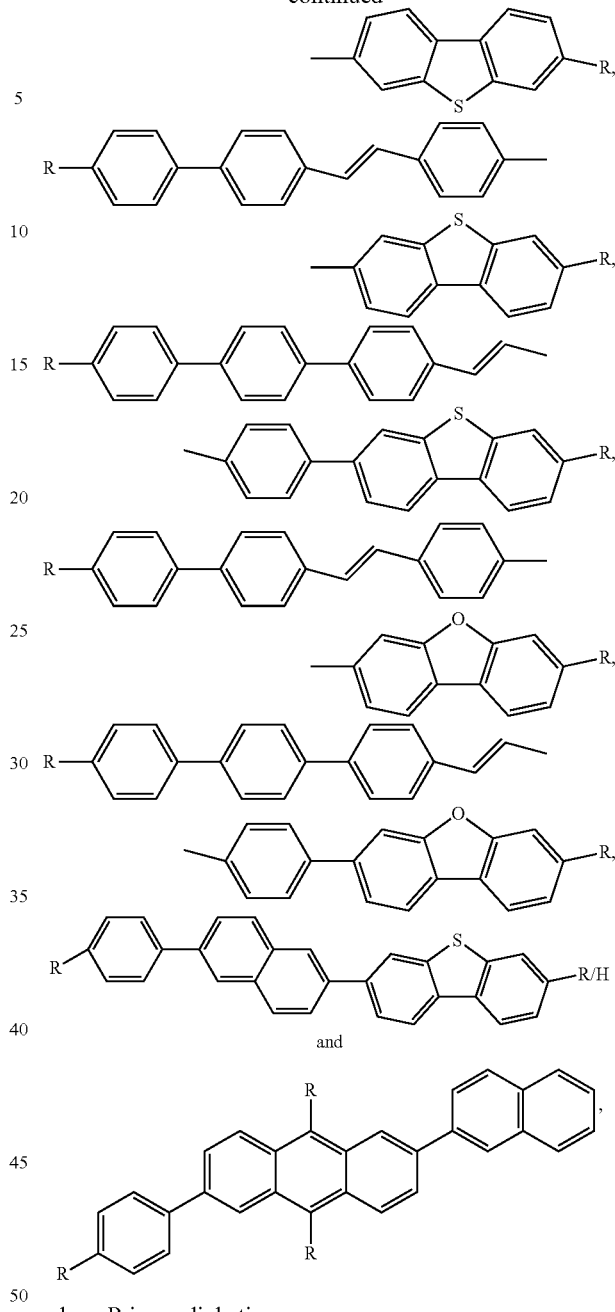

where R is an aliphatic group.

2. The device according to claim 1, wherein the liquid crystal emitting material has one of a lyotropic phase, a nematic phase, a smectic phase, a cholesteric phase and a discotic phase.

3. The device according to claim 1, wherein the liquid crystal emitting material has a liquid crystal phase characteristic at an operation temperature range of the OLED device.

4. The device according to claim 3, wherein the operation temperature range is 25 to 500° C.

5. The device according to claim 1, further comprising a horizontal orientation layer disposed between the first electrode and the emitting material layer or between the second electrode and the emitting material layer.

6. A liquid crystal emitting material present in an emitting material layer of an organic emitting material diode, wherein the liquid crystal emitting material is selected from the group consisting of:

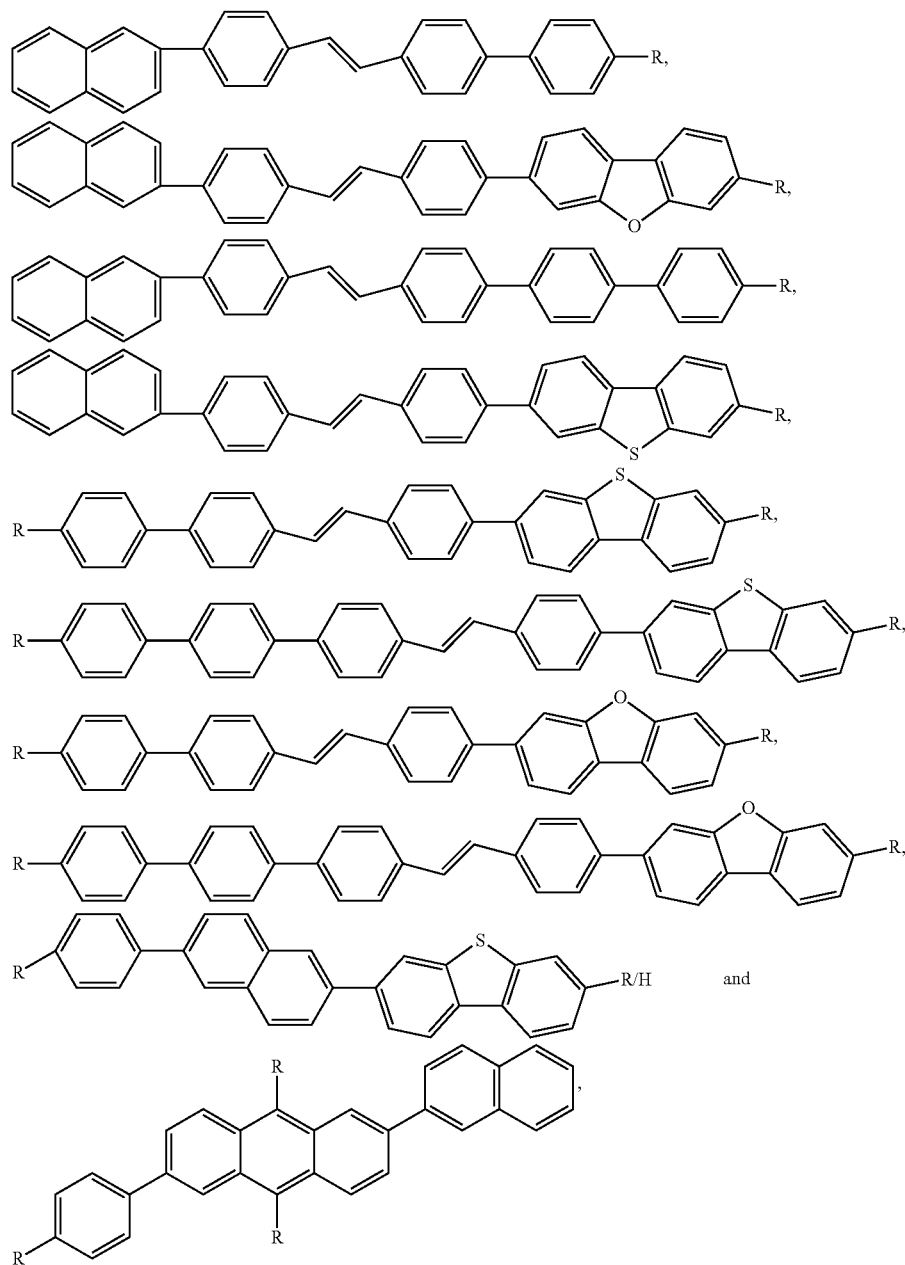
where R is an aliphatic group.